United States Patent [19]

Araya

[11] Patent Number: 5,440,253
[45] Date of Patent: Aug. 8, 1995

[54] SEMICONDUCTOR INTEGRATED COMPARATOR CIRCUIT

[75] Inventor: Yukihiro Araya, Itami, Japan

[73] Assignee: Mitsubishi Denki Kabushiki Kaisha, Tokyo, Japan

[21] Appl. No.: 105,809

[22] Filed: Aug. 13, 1993

[30] Foreign Application Priority Data

Aug. 26, 1992 [JP] Japan .................. 4-227279

[51] Int. Cl.$^6$ .............................. H03K 5/22
[52] U.S. Cl. ..................... 327/69; 327/63; 327/563
[58] Field of Search .............. 307/350, 355, 494, 236, 307/242, 202.1; 330/252, 253, 261; 327/50, 63–70, 560–563, 403, 309

[56] References Cited

U.S. PATENT DOCUMENTS

| 4,362,956 | 12/1982 | Ogasawara et al. | 307/355 |
| 5,049,761 | 9/1991 | Zitta | 307/494 |
| 5,115,151 | 5/1992 | Hull et al. | 307/355 |
| 5,166,548 | 11/1992 | Nelson | 307/494 |

FOREIGN PATENT DOCUMENTS

| 0117910 | 6/1985 | Japan | 307/355 |
| 403171649 | 7/1991 | Japan | 307/202.1 |

*Primary Examiner*—Timothy P. Callahan
*Assistant Examiner*—Toan Tran
*Attorney, Agent, or Firm*—Oblon, Spivak, McClelland, Maier & Neustadt

[57] ABSTRACT

A very dense polarity detection circuit which detects the polarity of a dc voltage on a transmission line. When incorporating such a very sense detection circuit, a semiconductor integrated circuit device is formed of a reduced number of parts. The polarity detection circuit for detecting the polarities of dc voltages on transmission lines (51) and (52) includes an input circuit (4), a clamp circuit (5), a comparison circuit (6) and a control circuit (7). The input circuit (4) has a high input impedance and receives a voltage-divide potential at a predetermined ratio. The clamp circuit (5) clamps outputs of the input circuit (4) at a predetermined voltage so that outputs from the clamp circuit (5) are not each smaller than a ground potential by a preselected voltage. The outputs of clamp circuit (5) are supplied to the comparison circuit (6) and the control circuit (7). The control circuit (7), judging that a potential difference between the transmission lines (51) and (52) is larger than the predetermined voltage, outputs a control signal by which the comparison circuit (6) compares potentials on the transmission lines (51) and (52) and outputs a result of comparison. Since the polarity detection circuit is highly densified, reduction is achieved in the number of parts which are necessary to fabricate the semiconductor integrated circuit device, and hence, in the size of the semiconductor integrated circuit device.

24 Claims, 12 Drawing Sheets

SEMICONDUCTOR INTEGRATED COMPARATOR CIRCUIT

BACKGROUND OF THE INVENTION

1. Field of the Invention

The present invention relates to semiconductor integrated circuit devices, particularly those which include a polarity detection circuit which detects the polarities of direct current voltages on a plurality of transmission lines each transfer both a signal and the direct current voltage.

2. Description of the Prior Art

FIG. 6 is a block diagram showing transmission lines, such as a home bus, and apparatuses connected thereto. In FIG. 6, indicated at reference characters 50a to 50d are apparatuses which perform various functions when applied with a dc voltage. Indicated at 51 and 52 are transmission lines connected to the apparatuses 50a to 50d to supply a dc voltage to the apparatuses 50a to 50d while superimposing signals which are routed between the apparatuses 50a to 50d on the dc voltage and transmitting the superimposed signals. Indicated at 53 is a dc power source which is connected to the transmission lines 51 and 52 through resistors 54 and 55 to supply a dc voltage to the apparatuses 50a to 50d. Indicated at 56 to 58 are a resistor and capacitors for suppressing distortion in the waveforms of signals on the transmission lines 51 and 52. As shown in FIG. 6, signals from the apparatuses 50a to 50d and dc voltages are applied between the transmission lines 51 and 52. Depending on the circumstances, the dc power source 53 may be connected to the transmission lines 51 and 52 in reverse. The polarities of the applied dc voltages, however, in most cases cannot be known by the appearances of the transmission lines 51 and 52. For instance, the transmission line 51 is not necessarily at higher level than the level of the transmission line 52, but rather, the transmission line 51 receives no dc voltage from the dc power source 53 in some cases. For this reason, the apparatuses 50a to 50d each comprise a circuit for detection of the polarities of the dc voltages applied to the transmission lines 51 and 52, as is common in the art.

FIG. 7 is an expanded view showing the part of FIG. 6 which is enclosed in the dashed line. The apparatus 50a comprises power source terminals 65 for receiving a dc voltage and a signal input/output terminal 66 for transmission of a signal through the capacitors 63 and 64. The signal input/output terminal 66 is connected, for example, to a driver/receiver circuit 61 to enable data transfer. To the power source terminals 65, a polarity detection circuit 60 is connected which receives dc voltages via the power source terminals 65 and detects the polarities of the dc voltages so that use of a dc voltage in the apparatus 50a is made possible. If power source is to be provided to the apparatus 50a through the transmission lines 51 and 52, a power source circuit is necessary which is connected to the apparatus 50a through a bridge circuit. In FIG. 7, such a power source circuit is not shown.

FIG. 8 is a circuitry diagram showing an example of the polarity detection circuit of FIG. 7. In FIG. 8, the transmission lines are labeled 51 and 52 and the polarity detection circuit is labeled 60. Indicated at reference numeral 75 is a current limit resistor connected at one end to the transmission line 52 to limit a current flowing in the polarity detection circuit 60. Indicated at 72 and 73 are protection diodes which are connected between the other end of the current limit resistor 75 and the transmission line 51. At reference numeral 69, a diode is shown which has an anode connected to the other end of the current limit resistor 75. Indicated at 67 is a photo coupler having an anode of its light emitting diode connected to a cathode of the diode 69, a cathode of its light emitting diode connected to the transmission line 51 and an emitter of its photo transistor grounded. A pull-up resistor is labelled 74a which has one end connected to a collector of the photo transistor of the photo coupler 67 and the other end connected to the power source. When a voltage on the transmission line 51 is lower than a voltage on the transmission line 52 and larger in absolute value than the sum of a threshold voltage of the diode 69 and a threshold voltage of the photo coupler 67, a current flow is initiated which flows from the transmission line 52 to the transmission line 51 through the diode 69, the photo coupler 67 and the current limit resistor 75. If this happens, an output signal POI from a polarity detection signal output terminal 76 changes from "H" level to "L" level.

Indicated at reference numeral 70 is a diode which has a cathode connected to the other end of the current limit resistor 75. Indicated at 68 is a photo coupler having a cathode of its light emitting diode connected to an anode of the diode 70, an anode of its light emitting diode connected to the transmission line 51 and an emitter of its photo transistor grounded. A pull-up resistor is labelled 74b which has one end connected to a collector of the photo transistor of the photo coupler 68 and the other end connected to the power source. When a voltage on the transmission line 51 is higher than that on the transmission line 52 and larger in absolute value than the sum of a threshold voltage of the diode 70 and a threshold voltage of the photo coupler 68, a current start flowing from the transmission line 51 to the transmission line 52 through the diode 70, the photo coupler 68 and the current limit resistor 75. As a result, an output signal PO2 from a polarity detection signal output terminal 77 changes from "H" level to "L" level. The polarities of voltages on the transmission lines 51 and 52 are judged from the output signals PO1 and PO2 which are available from the polarity detection circuit 60. The polarity detection circuit 60 is insulated from the circuits beyond the transmission lines 51 and 52 and the output terminals 76 and 77 by the existence of the photo couplers 67 and 68.

Having such a construction as described above, the conventional semiconductor integrated circuit device requires discrete parts such as photo couplers to be used therein. Hence, an increased number of parts are necessary, resulting in a larger device size and a high product price.

SUMMARY OF THE INVENTION

In a first aspect of the invention, a semiconductor integrated circuit device is connected to a first and a second transmission lines for supplying dc voltages of a first and a second potentials, respectively, and signals which are superimposed on the dc voltages. The semiconductor integrated circuit device performs detection regarding the dc voltages, and comprises: a first input terminal and a second input terminal respectively connected to the first transmission line and the second transmission line; a comparison circuit formed on a semiconductor substrate, the comparison circuit comprising: a control signal input terminal for receiving a control signal; a first input terminal and a second input terminal respectively coupled operative to the first and the second input terminals of the semiconductor integrated circuit device to receive potentials which are obtained in accordance with the first and the potentials which are inputted to the first and the second input terminals of the semiconductor integrated circuit device; and an output terminal, the comparison circuit comparing the first potential with the second potential based on a potential difference between its first and its second input terminals and outputting from its output terminal a result of comparison under the control of the control signal; a control circuit formed on the semiconductor substrate, the control circuit comprising: a control signal output terminal connected to the control signal input terminal of the comparison circuit; and a first input terminal and a second input terminal respectively coupled operative to the first and the second input terminals of the semiconductor integrated circuit device to receive potentials which are obtained in accordance with the first and the second potentials which are inputted to the first and the second input terminals of the semiconductor integrated circuit device, the control circuit outputting from its control signal output terminal a first control signal which calls for outputting of the result of comparison from the comparison circuit when a potential difference between its first and its second input terminals is equal to or larger than a predetermined level, the control circuit outputting from its control signal output terminal a second control signal which prohibits outputting of the result of comparison from the comparison circuit when the potential difference between its first and its second input terminals is smaller than predetermined level.

Preferably, the control circuit further comprises: a potential difference detection circuit which is connected to the first and the second input terminals of the control circuit, the potential difference detection circuit detecting whether a potential difference between the first and the second input terminals of the control circuit is equal to or larger than a predetermined level and outputting a result of detection; and a control signal generation circuit connected to the potential difference detection circuit, the control signal generation circuit generating and outputting one of the first and the second control signals in accordance with the result of detection.

Further, the potential difference detection circuit may comprise: a first transistor, a control electrode and one electrode of the first transistor both being connected to the first input terminal of the control circuit, the other terminal of the first transistor being connected to the second input terminal of the control circuit; a second transistor, a control electrode of the second transistor being connected to the first input terminal of the control circuit, one electrode of the second transistor being connected to the control signal generation circuit, the other electrode of the second transistor being connected to the second input terminal of the control circuit, the second transistor in combination with the first transistor forming a current mirror circuit; a third transistor, a control electrode and one electrode of the third transistor both being connected to the second input terminal of the control circuit, the other terminal of the third transistor being connected to the first input terminal of the control circuit; and a fourth transistor, a control electrode of the fourth transistor being connected to the second input terminal of the control circuit, one electrode of the fourth transistor being connected to the control signal generation circuit, the other electrode of the fourth transistor being connected to the first input terminal of the control circuit, the fourth transistor in combination with the third transistor forming a current mirror circuit.

Further, the control signal generation circuit may comprise: a fifth transistor, one electrode of the fifth transistor being connected to the one electrodes of the second and the fourth transistors, the other electrode of the fifth transistor being connected to a power source, a control electrode of the fifth transistor being connected to its one electrode or its other electrode; sixth and seventh transistors, control electrodes of the sixth and seventh transistors being connected to the control electrode of the fifth transistor, one electrodes of the sixth and seventh transistors being connected to the power source, the sixth and seventh transistors in combination with the fifth transistor forming a current mirror circuit; first voltage drop means having one terminal connected to the other electrode of the sixth transistor; second voltage drop means having one terminal connected to the other electrode of the seventh transistor; an eighth transistor, a control electrode of the eighth transistor being connected to other terminal of the first voltage drop means, one electrode of the eighth transistor being connected to a third potential; a ninth transistor, a control electrode of the ninth transistor being connected to other terminal of the second voltage drop means, one electrode of the ninth transistor being connected to the third potential; a first constant current source having one terminal connected to the other electrode of the eighth transistor, the first constant current source supplying a predetermined dc current; a second constant current source having one terminal connected to the other electrode of the ninth transistor, the first constant current source supplying a predetermined dc current; a tenth transistor, a control electrode of the tenth transistor being connected to the other electrode of the eighth transistor, one electrode of the tenth transistor being connected to the third potential, the tenth transistor outputting the first or the second control signal from its other electrode; and an eleventh transistor, a control electrode of the eleventh transistor being connected to the other electrode of the ninth transistor, one electrode of the eleventh transistor being connected to the third potential, the eleventh transistor outputting the first or the second control signal from its other electrode.

The comparison circuit may comprise: a first differential amplifier circuit, the first differential amplifier circuit receiving respectively at its noninverted and inverted input terminals potentials given to the first and the second input terminals of the comparison circuit; and a second differential amplifier circuit, the second differential amplifier circuit receiving respectively at its noninverted and inverted input terminals potentials given to the first and the second input terminals of the comparison circuit.

The comparison circuit may further comprise: a first output circuit for receiving an output of the first differential amplifier circuit and an output of the control signal generation circuit, the first output circuit outputting a signal in accordance with the output from the first differential amplifier circuit if the output from the control signal generation circuit is the first control signal, the first output circuit outputting no signal in accordance with the output from the first differential amplifier circuit if the output from the control signal generation circuit is the second control signal; and a second output circuit for receiving an output of the second differential amplifier circuit and an output of the control signal generation circuit, the second output circuit outputting a signal in accordance with the output from the second differential amplifier circuit if the output from the control signal generation circuit is the first control signal, the second output circuit outputting no signal in accordance with the output from the second differential amplifier circuit if the output from the control signal generation circuit is the second control signal.

The first output circuit may comprise: a first transistor, a control electrode of the first transistor receiving an output of the first differential amplifier circuit, one electrode of the first transistor being connected to a third potential; a first constant current source for supplying a predetermined constant current to the other electrode of the first transistor; a second transistor, one electrode of the second transistor being connected to the third potential, a control electrode of the second transistor being connected to the other one electrode of the first transistor, the second transistor receiving in the control electrode an output of the control signal generation circuit; and first voltage drop means, one terminal of the first voltage drop means being connected to other electrode of the second transistor, the other terminal of the first voltage drop means being connected to a power source. The second output circuit may comprise: a third transistor, a control electrode of the third transistor receiving an output of the second differential amplifier circuit, one electrode of the third transistor being connected to the third potential; a second constant current source for supplying a predetermined dc voltage to the other electrode of the third transistor; a fourth transistor, one electrode of the fourth transistor being connected to the third potential, a control electrode of the fourth transistor being connected to the other one electrode of the third transistor, the fourth transistor receiving in the control electrode an output of the control signal generation circuit; and second voltage drop means, one terminal of the second voltage drop means being connected to other electrode of the fourth transistor, the other terminal of the second voltage drop means being connected to the power source. The other electrode of the second transistor serves as an output terminal of the first output circuit and the other electrode of the fourth transistor serves as an output terminal of the second output circuit.

The first and the second differential amplifier circuits may each further comprise an active load.

The first differential amplifier circuit may further comprise: a first constant current source for supplying a poredetermined dc current; a first transistor, a control electrode of the first transistor being connected to the noninverted input terminal of the first differential amplifier circuit, one electrode of the first transistor being connected to one terminal of the first constant current source; a second transistor, a control electrode of the second transistor being connected to the inverted input terminal of the first differential amplifier circuit, one electrode of the second transistor being connected to the one terminal of the first constant current source; a third transistor, one electrode and a control electrode of the third transistor being connected to the other electrode of the first transistor, the other electrode of the third transistor being connected to the third potential; and a fourth transistor, one electrode of the fourth transistor being connected to the other electrode of the second transistor, a control electrode of the fourth transistor being connected to the control electrode of the third transistor, the other electrode of the fourth transistor being connected to the third potential, the other electrode of the fourth transistor serving as an output terminal of the first differential amplifier circuit. The second differential amplifier circuit may further comprise: a second current source for supplying a predetermined dc current; a fifth transistor, a control electrode of the fifth transistor being connected to the noninverted input terminal of the second differential amplifier circuit, one electrode of the fifth transistor being connected to one terminal of the second constant current source; a sixth transistor, a control electrode of the sixth transistor being connected to the inverted input terminal of the second differential amplifier circuit, one electrode of the sixth transistor being connected to one terminal of the second the constant current source; a seventh transistor, one electrode and a control electrode of the seventh transistor being connected to the other electrode of the fifth transistor, the other electrode of the seventh transistor being connected to the third potential; and an eighth transistor, one electrode of the eighth transistor being connected to the other electrode of the sixth transistor, a control electrode of the eighth transistor being connected to the second control electrode of the seventh transistor, the other electrode of the eighth transistor being connected to the third potential, the other electrode of the eighth transistor serving as an output terminal of the second differential amplifier circuit.

The control circuit preferably comprises: a first buffer circuit connected between the first and the second input terminals of the control circuit and the noninverted and the inverted input terminals of the first differential amplifier circuit, the first buffer circuit reducing bad interaction between the first and the second input terminals of the control circuit and the noninverted and the inverted input terminals of the first differential amplifier circuit; and a second buffer circuit connected between the first and the second input terminals of the control circuit and the noninverted and the inverted input terminals of the second differential amplifier circuit, the first buffer circuit reducing bad interaction between the first and the second input terminals of the control circuit and the noninverted and the inverted input terminals of the second differential amplifier circuit.

The first buffer circuit may comprise: a first transistor, a control electrode of the first transistor being connected to the first input terminal of the control circuit, one electrode of the first transistor being connected to the noninverted input terminal of the first differential amplifier circuit, the other electrode of the first transistor being connected to a third potential; a first constant current source connected to the one electrode of the first transistor to supply a predetermined dc voltage; a second transistor, a control electrode of the second transistor being connected to the second input terminal of the control circuit, one electrode of the second transistor being connected to the inverted input terminal of the first differential amplifier circuit, the other electrode of the second transistor being connected to the third potential; and a second constant current source connected to the one electrode of the second transistor to supply a predetermined dc voltage. The second buffer circuit may comprise: a third transistor, a control electrode of the third transistor being connected to the first input terminal of the control circuit, one electrode of the third transistor being connected to the noninverted input terminal of the second differential amplifier circuit, the other electrode of the third transistor being connected to the third potential; a third constant current source connected to the one electrode of the third transistor to supply a predetermined dc voltage; a fourth transistor, a control electrode of the fourth transistor being connected to the second input terminal of the control circuit, one electrode of the fourth transistor being connected to the inverted input terminal of the second differential amplifier circuit, the other electrode of the fourth transistor being connected to the third potential; and a fourth constant current source connected to the one electrode of the fourth transistor to supply a predetermined dc voltage.

Thus, when a difference between potentials at the first and the second input terminals reaches to or above a predetermined value, the control circuit outputs the first control signal which demands the comparison circuit to output a result of comparison about potentials on the first and the second transmission lines. When a difference between potentials at the first and the second input terminals is smaller than the predetermined value, the control circuit outputs the second control signal which prohibits outputting of the result of comparison from the comparison circuit. Hence, the comparison circuit is disabled so that a small variation in the voltages on the first and the second transmission lines will not cause outputting a result of comparison from the comparison circuit. In addition, since the semiconductor integrated circuit device includes the comparison circuit, it is possible that the semiconductor integrated circuit device has a polarity detection function and a densified structure which promises a high responding speed when even a small potential difference is given. In a neutral zone of a certain range ensured in the in polarity detection function, the result of comparison about the potentials on the first and the second transmission lines would not be outputted. The polarity detection circuit, comprised of the comparison circuit and the control circuit, is highly densified, and therefore, is formed with less number of parts. This also contributes to reduction in the size and the price of the semiconductor integrated circuit device.

In a second aspect of the invention, the semiconductor integrated circuit device of the first aspect further comprises an input circuit having a high input impedance. The input circuit comprises: a first and a second input terminals respectively connected to the first and the second input terminals of the semiconductor integrated circuit device; and a first and a second output terminals respectively connected to the first and the second input terminals of the comparison circuit and the control circuit, the input circuit voltage-dividing at a preselected ratio potential differences between its first terminal and a reference potential and between its second input terminal and a reference potential, and outputting divided potentials.

The input circuit may consist only of voltage drop means.

Further, the input circuit may comprise: first voltage drop means, one terminal of the first voltage drop means being connected to the first input terminal of the input circuit, the other terminal of the first voltage drop means being connected to the first output terminal of the input circuit; second voltage drop means, one terminal of the second voltage drop means being connected to the second input terminal of the input circuit, the other terminal of the second voltage drop means being connected to the second output terminal of the input circuit; third voltage drop means, one terminal of the third voltage drop means being connected to the other terminal of the first voltage drop means, the other terminal of the third voltage drop means being connected to a third potential; and fourth voltage drop means, one terminal of the fourth voltage drop means being connected to the other terminal of the second voltage drop means, the other terminal of fourth third voltage drop means being connected to the third potential.

Preferably, the first, the second, the third and the fourth voltage drop means are formed on the semiconductor substrate.

Alternatively, the semiconductor integrated circuit device of claim 14, wherein the first, the second, the third and the fourth voltage drop means are formed outside the semiconductor substrate.

Alternatively, the resistance ratio of the resistance of the first voltage drop means to the resistance of the third voltage drop means is equal to a resistance ratio of the resistance of the second voltage drop means to the resistance of the fourth voltage drop means.

At least one of the second and the fourth voltage drop means may be formed on the semiconductor substrate and may include a plurality of resistor means which are connected in parallel.

Otherwise, the resistance of the at least one of the second and the fourth voltage drop means may be changed by disconnecting the plurality of the resistor means connected in parallel by irradiation of a laser.

Thus, the input circuit of the second aspect of the invention has a high input impedance, thereby improving insulation between the first and the second transmission lines and the circuit structure beyond the input circuit. In addition, the width of the neutral zone in which the second control signal renders the comparison circuit ineffective can be changed to any desired width by changing a voltage-dividing ratio of a potential in the input circuit through the first transmission line to the reference potential and a voltage-dividing ratio of a potential in the input circuit through the second transmission line to the reference potential. Further, since the input circuit has a high impedance, the first and the second transmission lines would not exert large influence the semiconductor integrated circuit device. This is true of influence vice versa.

In a third aspect of the invention, the semiconductor integrated circuit device of the second aspect, further comprises a clamp circuit, the clamp circuit being formed on the semiconductor substrate, the clamp circuit being connected to the first and the second output terminals of the input circuit, the clamp circuit limiting potential differences between the first output terminal of the input circuit and the reference potential and between the second output terminal of the input circuit and the reference potential to a predetermined voltage.

The clamp circuit may comprise: a first switching element connected to the first output terminal of the input circuit, when a potential difference between the first output terminal and the third potential reaching the predetermined voltage, the first switching element turning on to limit the potential difference to less than the predetermined voltage; and a second switching element connected to the second output terminal of the input circuit, when a potential difference between the second output terminal and the third potential reaching the predetermined voltage, the first switching element turning on to reduce the potential difference to less than the predetermined voltage.

Preferably, the first switching element includes a first transistor, one electrode of the first transistor being connected to the first output terminal of the input circuit, the other electrode of the first transistor being connected to a power source; and the second switching element includes a second transistor, one electrode of the second transistor being connected to the second output terminal of the input circuit, the other electrode of the second transistor being connected to the power source. The clamp circuit may further comprise: first voltage drop means connected between a control electrode of the first transistor and the power source; second voltage drop means connected between a control electrode of the second transistor and the power source; third voltage drop means connected between the control electrode of the first transistor and the third potential; and fourth voltage drop means connected between the control electrode of the second transistor and the third potential.

Thus, the clamp circuit of the third aspect suppresses a potential difference between potentials at the first and the second output terminals of the input circuit to less than the predetermined voltage. Hence, a parasitic element which is formed on the semiconductor substrate would not easily turn on, thereby preventing circuit failure of the semiconductor integrated circuit device. Equally important, larger potentials may be used on the first and the second transmission lines, and therefore, the semiconductor integrated circuit device is used to a wider range of applications.

In a fourth aspect of the invention, the predetermined level is set for a threshold voltage which calls for switching of a predetermined switching element.

Thus, in the fourth aspect, since the threshold voltage which calls for switching of a predetermined switching element is the predetermined value which serves as a threshold value for deciding whether outputting of the first and the second control, setting of the neutral zone, in which the comparison circuit is prevented from outputting a signal, is made possible using only switching element. This enables the control circuit to have a simple structure, which in turn allows that semiconductor integrated circuit device is further densified and formed by even less parts. As compared with the semiconductor integrated circuit devices for detecting the polarities on the first and the second transmission lines of the other aspects, the semiconductor integrated circuit device of the fourth aspect requires smaller costs.

Accordingly, it is an object of the present invention to obtain a densified polarity detection circuit, and hence in manufacturing a semiconductor integrated circuit for detecting the polarity on a transmission line, to form the semiconductor integrated circuit with a reduced number of parts.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
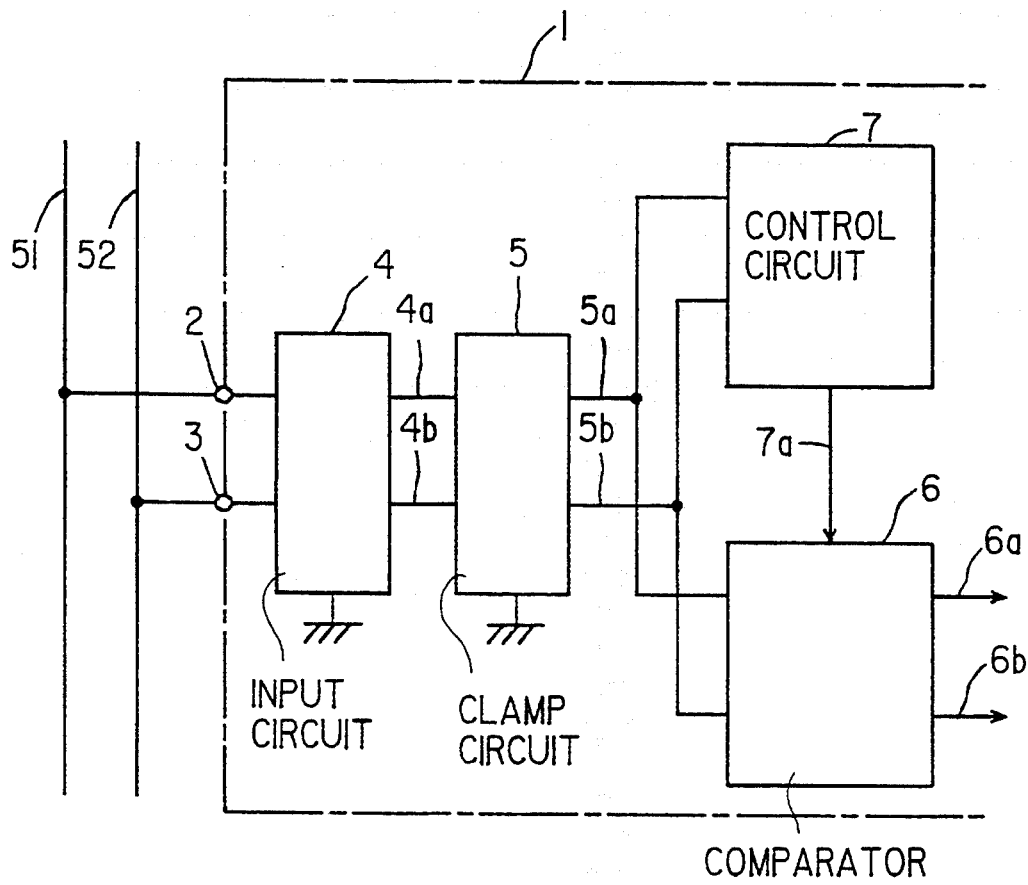
FIG. 1 is a block diagram showing a structure of a semiconductor integrated circuit device according to the first preferred embodiment of the present invention.
Figure 6:
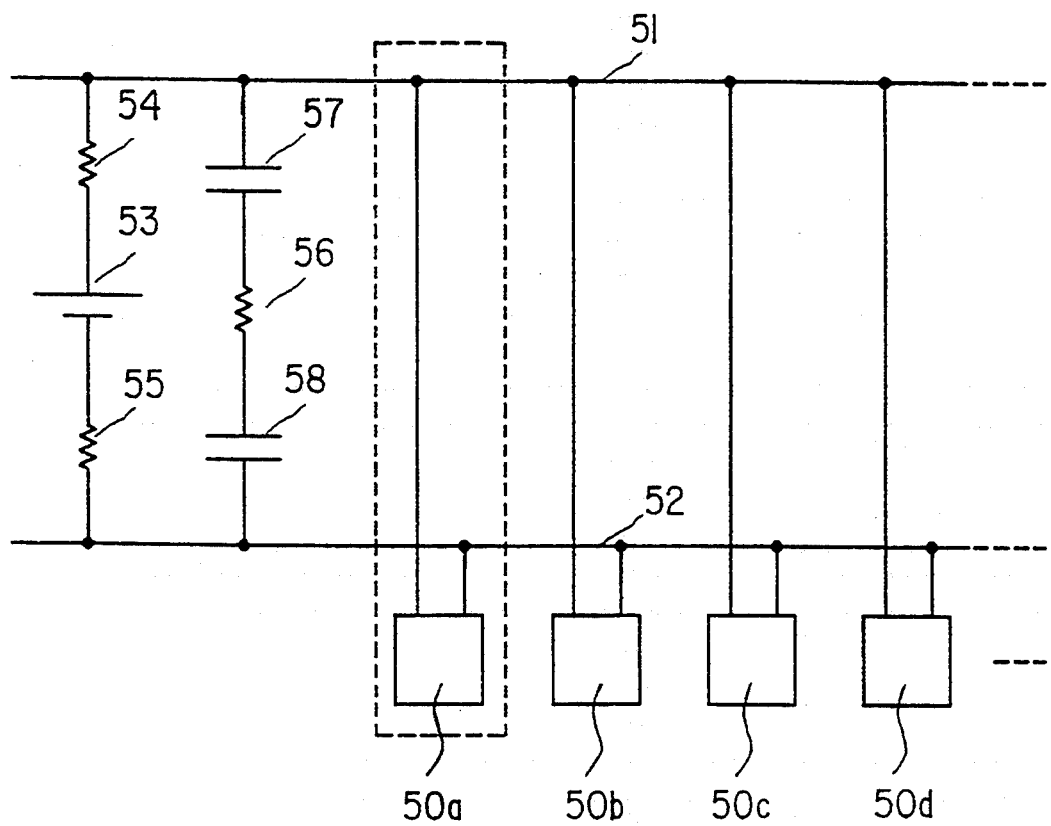
FIG. 6 is a block diagram showing how transmission lines and apparatuses are connected with each other in a conventional manner.
Figure 7:
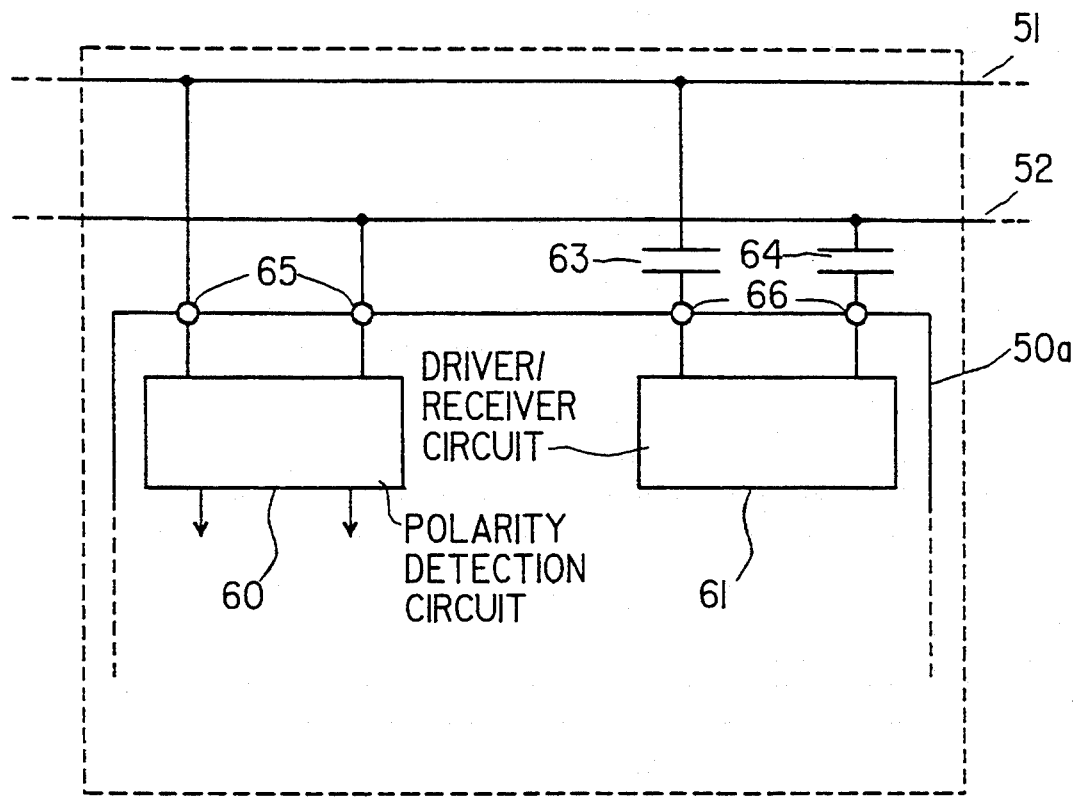
FIG. 7 is a block diagram showing a portion of the structure of one of the apparatuses of FIG. 6.
Figure 8:
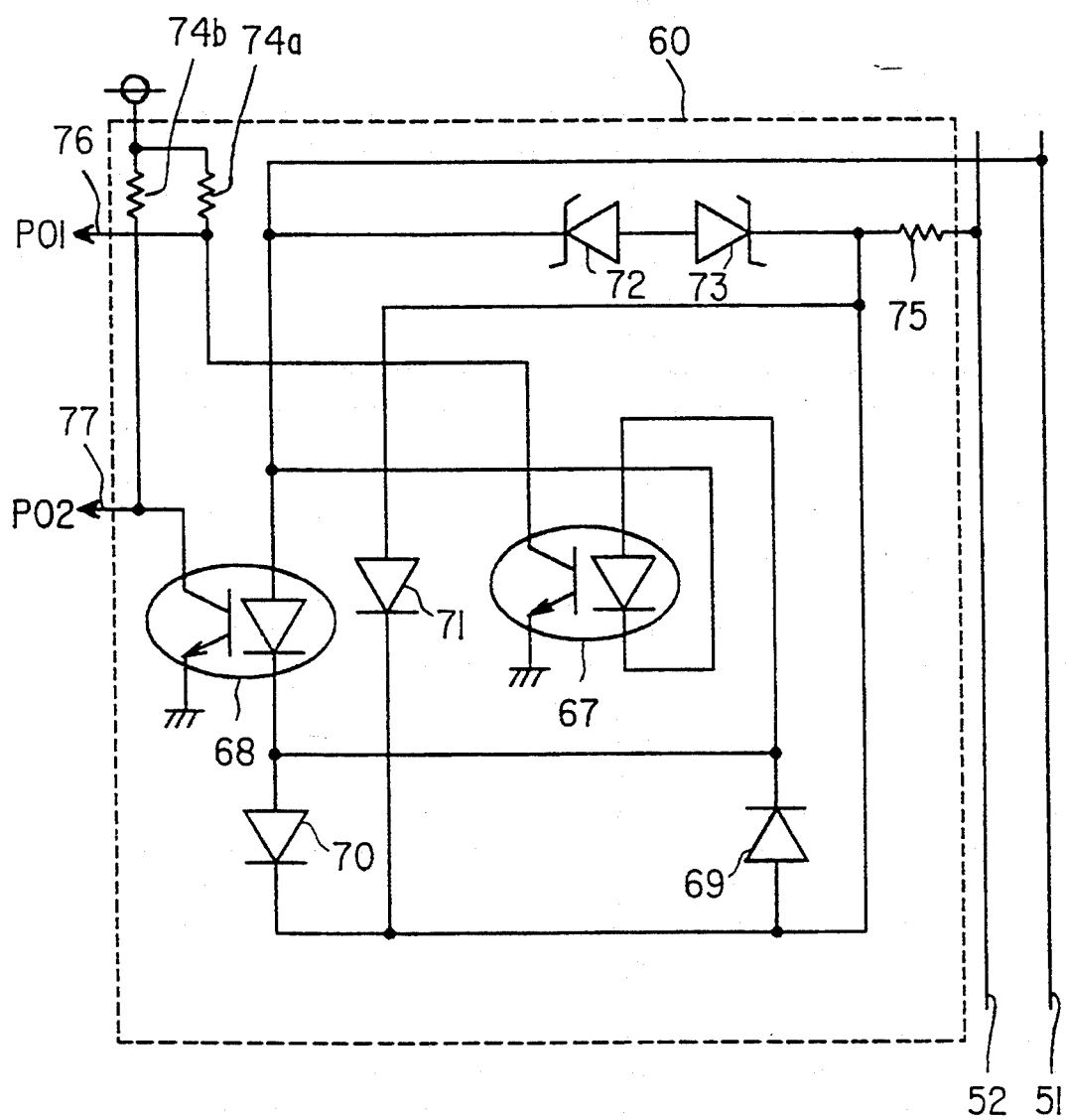
FIG. 8 is a block diagram showing a structure of a conventional polarity detection circuit.

A first preferred embodiment of the present invention will be described with reference to drawings. FIG. 1 is a block diagram showing a structure of a semiconductor integrated circuit device equipped with a polarity detection function according to the first preferred embodiment of the present invention. In FIG. 1, indicated at 51 and 52 are transmission lines which are similar to the transmission lines that are shown in FIG. 6. At reference numeral 1, a semiconductor integrated circuit device is shown which is equipped with a function to detect the polarity of a dc voltage provided through the transmission lines 51 and 52. At reference numerals 2 and 3 are indicated input terminals provided within the semiconductor integrated circuit device 1 and connected to the transmission lines 51 and 52. Indicated at 4 is an input circuit which is connected to the input terminals 2 and 3 and which divides and outputs a potential difference between a potential on the transmission line 51 and a ground potential and a potential difference between a potential on the transmission line 52 and the ground potential. At reference numeral 5, a clamp circuit is shown which receives outputs from the input circuit 4 and limits the outputs such that the outputs will not be each smaller than a predetermined level with respect to the ground potential. A control circuit is labelled 7 which judges whether the outputs given from the input circuit 4 through the clamp circuit 5 are each a potential difference of a certain level or more and which then outputs a control signal which instructs whether the outputs of the input circuit 4 are to be given to a comparator 6. The comparator 6 compares the output voltages which are outputted from the input circuit 4 through the clamp circuit 5 and outputs a result of the comparison. The input circuit 4, the clamp circuit 5, the comparator 6 and the control circuit 7 are formed on the same semiconductor substrate, and therefore, compared with a conventional polarity detection circuit, the novel polarity detection circuit requires less number of parts and hence smaller dimensions.

Next, operations of the semiconductor integrated circuit device 1 will be described. For example, assume that the transmission line 51 is at a potential of 15 V and the transmission line 52 is at a potential of −5 V as compared with the ground potential. These potentials are received through the input terminals 2 and 3 by the input circuit 4 wherein they are voltage-divided at a certain ratio. With the voltage dividing ratio of 1/5, for instance, from these potentials, voltages of 3 V and −1 V are obtainable respectively from the output terminals 4a and 4b of the input circuit 4. If the clamp circuit 5 is set so that an output therefrom will not be smaller than −0.4 V, voltages of 3 V and −0.4 V are outputted from the output terminals 5a and 5b of the clamp circuit 5. The control circuit 7 then judges whether a potential difference between the output terminals 5a and 5b of the clamp circuit 5 is equal to or larger than a predetermined voltage. If the predetermined voltage is 3 V, for instance, since the potential difference between the output terminals 5a and 5b is 3.4 V, the control circuit 7 outputs at its output terminal 7a a control signal which will be then routed to the comparator 6 to enable an output of the comparator 6. In response to the control signal, the comparator 6 compares the output voltages received from the clamp circuit 5 and outputs at its output terminals 6a and 6b a signal which indicates that the output voltage from the output terminal 5a is larger than the output voltage from the output terminal 5b, i.e., the transmission line 51 is at higher level than the transmission line 52. Differently from this, if the transmission line 51 is at a potential of 10 V and the transmission line 52 is at a potential of −5 V, for instance, the operations above of the circuits 4 to 7 produce a potential difference of 2.4 V between the output terminals 5a and 5b of the clamp circuit 5, and therefore, the control circuit 7 outputs a control signal which demands to disable an output of the comparator 6.

Figure 2:
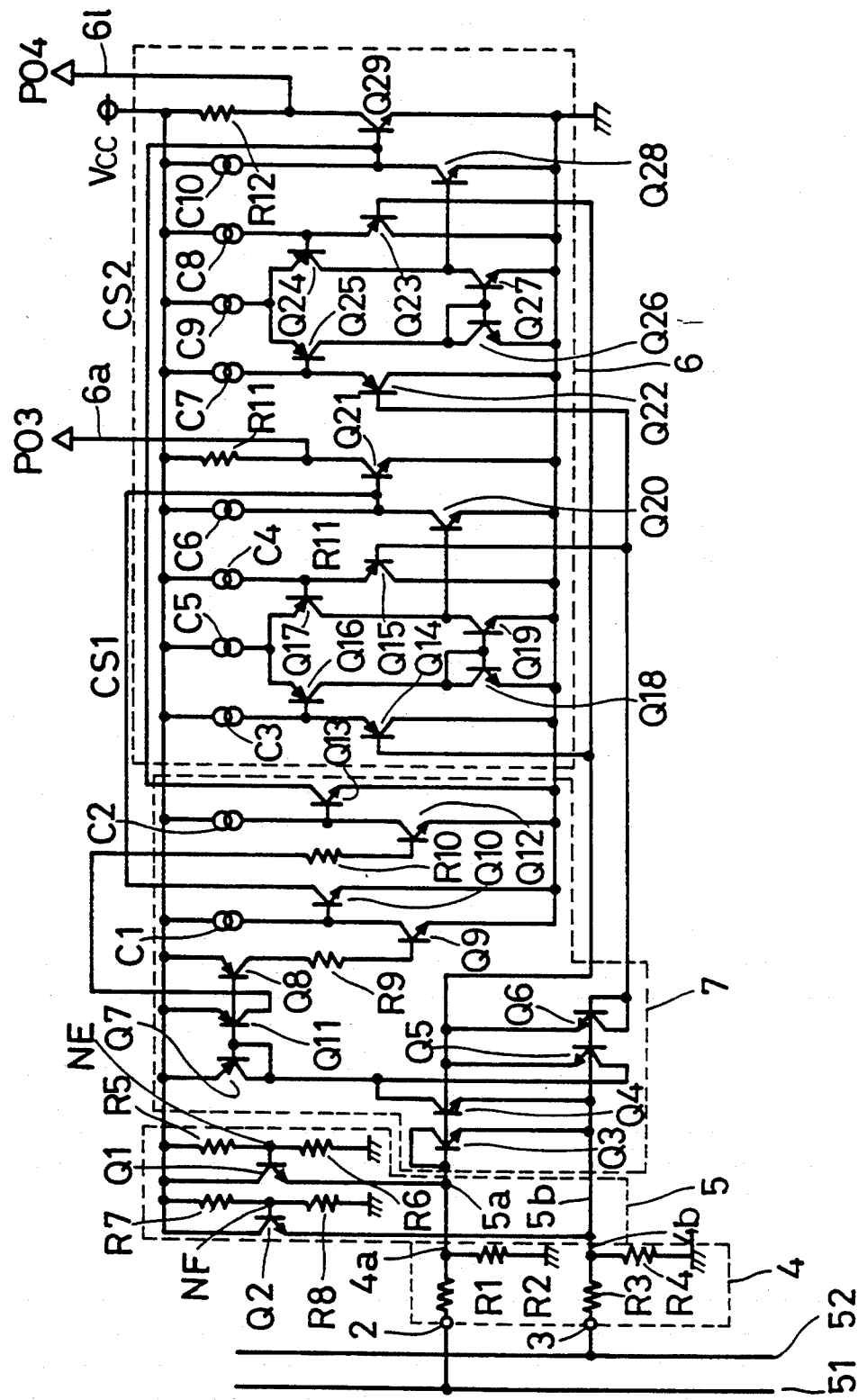
FIG. 2 is a circuitry diagram showing the structure of the semiconductor integrated circuit device according to the first preferred embodiment.

FIG. 2 is a circuitry diagram showing circuit structures of the circuits of FIG. 1. In FIG. 2, parts similar or corresponding to those previously described with FIG. 1 are denoted by similar reference characters. The input circuit 4 is formed by resistors R1 to R4. The resistors R1 and R2 are connected in series between the input terminal 2 and the ground potential. A ratio of the resistance of the resistor R2 to the sum of the resistances of the resistors R1 and R2 determines a voltage which is to be outputted at the output terminal 4a. Likewise the resistors R1 and R2, the resistors R3 and R4 are connected in series between the input terminal 3 and the ground potential. A voltage to be outputted at the output terminal 4b is determined by a ratio of the resistance of the resistor R4 to the sum of the resistances of the resistors R3 and R4. To enhance an input impedance of the input circuit 4, the resistors R1 and R3 are each formed to have a high resistance, as is standard in the art. If the resistance ratio regarding the resistors R1 and R2 is the same as the resistance ratio regarding the resistors R3 and R4, even with changes in the potentials on the transmission lines 51 and 52, as long as a potential difference between the transmission lines 51 and 52 remains unchanged, a potential difference between the output terminals 4a and 4b will also remain at a certain level regardless of the potential levels on the transmission lines 51 and 52. Hence, the width of the neutral zone in which the comparator 6 stays disabled remains unchanged regardless of the potentials on the transmission lines 51 and 52. Conversely, if a change is wanted in the width of the neutral zone of the comparator 6 in accordance with the potentials on the transmission lines 51 and 52, the resistance ratio regarding the resistors R1 and R2 and the resistance ratio regarding the resistors R3 and R4 are changed as required.

Figure 11:
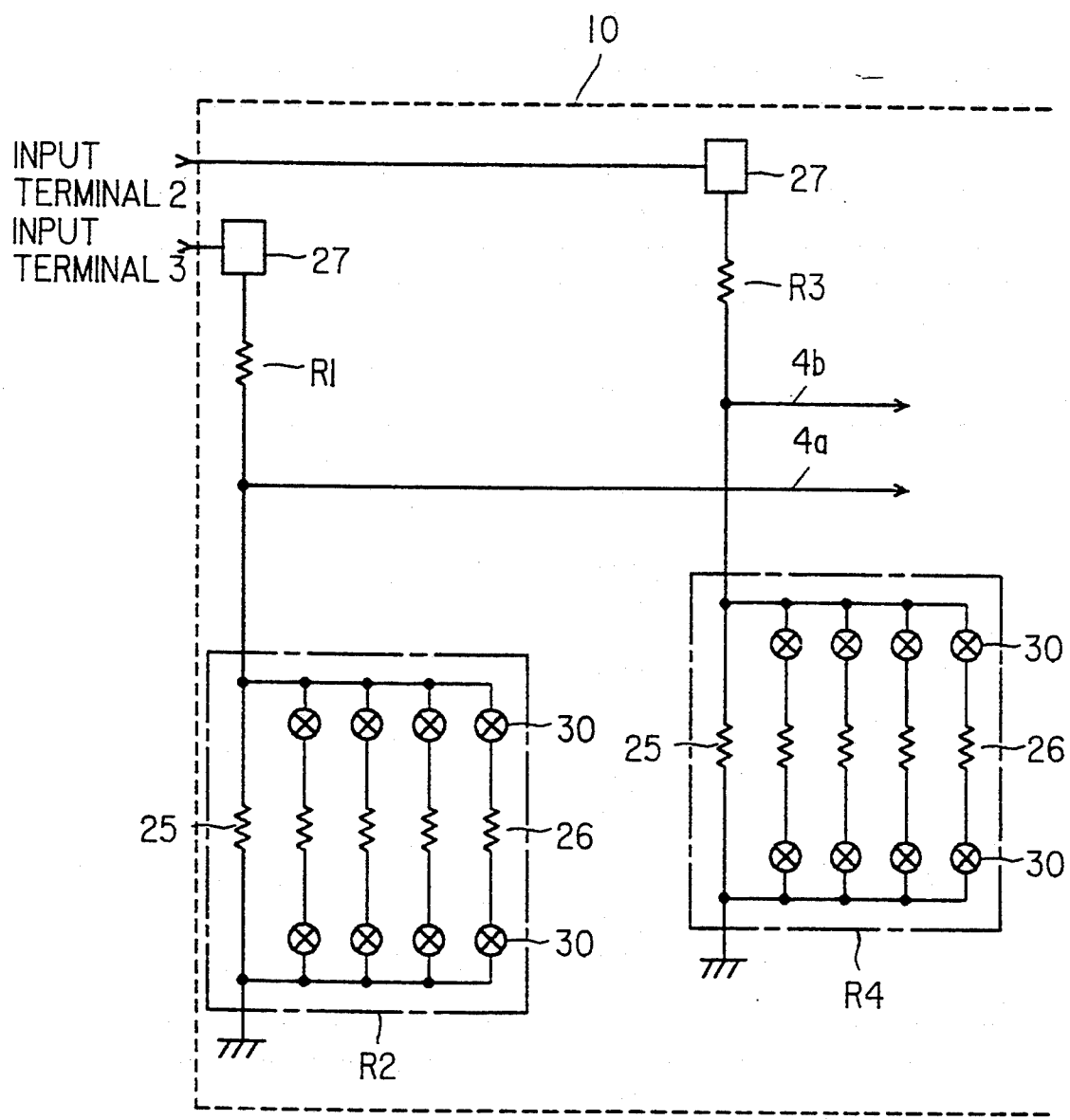
FIG. 11 is a plan view showing a structure of an input circuit built in the semiconductor integrated circuit device of FIG. 2.

As means for changing the resistances of the resistors R2 and R4 which are formed on the semiconductor substrate, a plurality of resistors connected in parallel with each other are also effective (FIG. 11). In FIG. 11, indicated at reference numerals 25 and 26 are diffusion resistors forming the resistors R2 and R4 which are formed on a semiconductor substrate 10, indicated at 27 is a pad for connecting the input terminals 2 and 3 to the semiconductor substrate 10, and indicated at 30 are fuses disposed at the both ends of the resistor 26. By blowing the fuses 30 by laser fusion and the like, the resistances of the resistors R2 and R4 are set at desirable values.

Next, the clamp circuit 5 will be described. The clamp circuit 5 is comprised of NPN transistors Q1 and Q2 and resistors R5 to R8. The resistors R5 and R6 are connected in series between the power source potential and the ground potential to divide a power source voltage and fix a base of the NPN transistor Q1 at an appropriate potential. When the potential at an emitter of the NPN transistor Q1, which is connected to the output terminal 4a of the input circuit 4, goes down to allow a base-emitter voltage to exceed a threshold voltage VBE1 of the NPN transistor Q1, the NPN transistor Q1 turns on so that a current flows from a collector of the NPN transistor Q1 which is connected to the power source into the input circuit 4, thereby clamping a potential at the output terminal 4a. For example, the resistance ratio regarding the resistors R5 and R6 is determined so as to obtain a potential of 0.3 V at a base of the NPN transistor Q2, a potential at the emitter of the NPN transistor Q1, which is given by (0.3 V−VBE1), is about −0.4 V, a potential enough to defeat a parasitic element. The resistors R7 and R8, the NPN transistor Q2 and the output terminal 4b are connected with each other in a similar manner in which the resistors R5 and R6, the NPN transistor Q1 and the output terminal 4a are connected with each other. Hence, it is possible to clamp a potential at the output terminal 4b. In this circuit, since the parasitic elements would turn on when the potentials at the output terminals 4a and 4b go negative, clamping of the potentials at a certain level or a level lower than the parasitic elements' turn on level must be avoided.

The control circuit 7 will now be described. The control circuit 7 is comprised of NPN transistors Q3 to Q6, Q9, Q10, Q12 and Q13, PNP transistors Q7, Q8 and Q11, resistors R9 and R10 and constant current sources C1 and C2. Bases of the NPN transistors Q3 and Q4 are connected to the output terminal 5a of the clamp circuit 5, and emitters of the NPN transistors Q3 and Q4 are connected to the output terminal 5b of the clamp circuit 5. A collector of the NPN transistor Q3 is also connected to the output terminal 5a. Hence, the NPN transistors Q3 and Q4 serve as a current mirror circuit. When a potential at the output terminal 5a becomes higher than a potential at the output terminal 5b and exceeds a threshold voltage VBE3 of the NPN transistor Q3, turning on of the NPN transistor Q3 occurs to initiate a current flow, followed by that the NPN transistor Q4 passes a current of the same level as the current flowing through the NPN transistor Q3 to thereby conduct the PNP transistor Q7 which has its collector connected to the collector of the NPN transistor Q4. As a result, a current flows from the power source through an emitter of the PNP transistor Q7.

In response to this, the PNP transistors Q8 and Q11 turn on, each of which has its base connected to the base of the PNP transistor Q7 and hence which together with the PNP transistor Q7 form a current mirror circuit, whereby a current flow from the power source to emitters of the PNP transistors Q8 and Q11, the current to the PNP transistors Q8 and Q11 having the same value as the current which flows the PNP transistor Q7. From the emitters of the PNP transistors Q8 and Q11, the current further flows to the resistors R9 and R10 to become a base current for the NPN transistors Q9 and Q12. Receiving a base current, the NPN transistors Q9 and Q12 turn on. As a result, a current outputted from the constant current sources C1 and C2, which are connected respectively to collectors of the NPN transistors Q9 and Q12, are routed from the collectors of the NPN transistors Q9 and Q12 to the ground potential through emitters of the NPN transistors Q9 and Q12.

This causes bases of the NPN transistors Q10 and Q13, which are connected respectively to the collectors of the NPN transistors Q9 and Q12, to be base current-starved, turning off the NPN transistors Q10 and Q13. In other words, in the NPN transistors Q10 and Q13, collectors, which has been staying at the same potential as the potential at grounded emitters under conduction of the NPN transistors Q10 and 013, enter high-impedance state due to nonconduction of the NPN transistors Q10 and Q13. This means that control signals CS1 and CS2 outputted from the control circuit 7 to the comparator 6 change from "L" level to "high impedance" condition.

In a similar manner, bases of the NPN transistors Q5 and Q6 are connected to the output terminal 5b of the clamp circuit 5 and emitters of the NPN transistors Q5 and Q6 are connected to the output terminal 5a of the clamp circuit 5. That is, the NPN transistors Q5 and Q6 are connected to serve as a current mirror circuit. When a potential at the output terminal 5b becomes higher than a potential at the output terminal 5a and exceeds a threshold voltage VBE5 of the NPN transistor Q5, turning on of the NPN transistor Q5 occurs to initiate a collector-emitter current. The NPN transistor Q6 passes the same level of current as the NPN transistor Q5 does, thereby enabling the PNP transistor Q7 which has its collector connected to a collector of the NPN transistor Q6. As a result, a current flows from the power source through the emitter of the PNP transistor Q7. The operations of the NPN transistors Q8, Q11 and associated transistors are the same as those seen in turning on of the PNP transistor Q7 due to behaviors of the NPN transistors Q3 and Q4. The comparator 6 would not operate unless a potential difference between the output terminals 5a and 5b of the clamp circuit 5 exceeds the threshold voltages VBE3 and VBE5 of the NPN transistors Q3 and Q5. Thus, the threshold voltages of the NPN transistors Q3 and Q5 determine the neutral zone.

Figure 12:
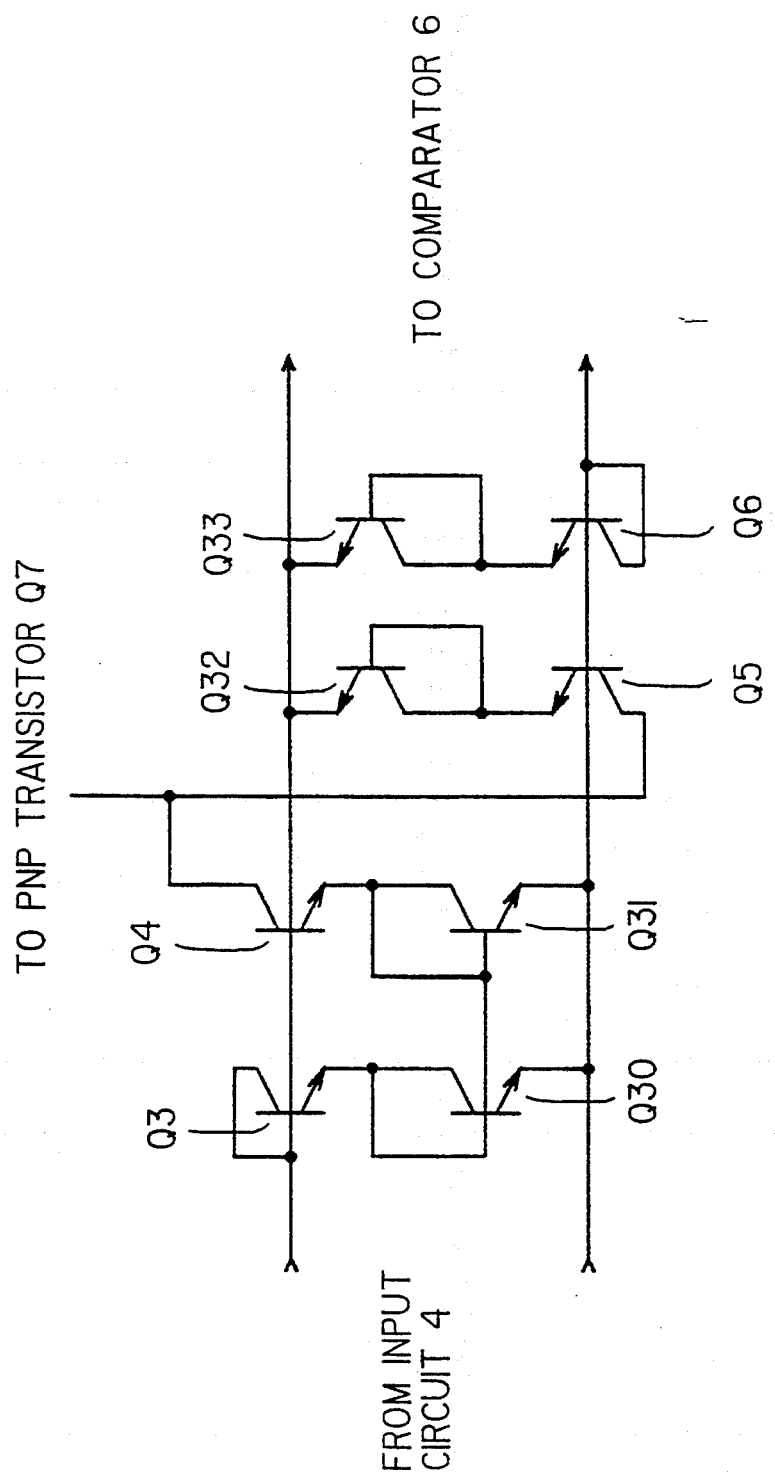
FIG. 12 is a circuitry diagram showing a modified structure of a control circuit built in the semiconductor integrated circuit device of FIG. 2.

A wider neutral zone is achievable by providing a structure as that shown in FIG. 12. In FIG. 12, NPN transistors Q30 to Q33 are disposed which have their bases and collectors connected with each other to thereby serve as a diode. By connecting the NPN transistors Q30 to Q33 to the NPN transistors Q3 to Q6 in series, the neutral zone is widened by threshold voltages of the NPN transistors Q30 to Q33.

Next, the comparator 6 will be described. The comparator 6 is formed by PNP transistors Q14 to Q17, Q22 to Q25, PNP transistors Q18 to Q21, Q26 to Q29, resistors R11 and R12 and constant current sources C3 to C10. The output terminals 5a and 5b of the clamp circuit 5 are connected to bases of the PNP transistors Q14 and Q15. The PNP transistors Q16 and Q17 have their bases connected to emitters of the PNP transistors Q14 and Q15 and hence form a differential pair. A base potential at the PNP transistors Q16 and Q17 is equal to the sum of a base potential at the PNP transistors Q14 and Q15 and a base-emitter voltage of the PNP transistors Q14 and Q15. A base current for the PNP transistors Q16 and Q17 is supplied from the constant current sources C3 and C4. The PNP transistors Q14 and Q15 and the constant current sources C3 and C4 serve as a circuit which reduces influence of the base current for the PNP transistors Q16 and Q17 which form a differential pair.

When a potential at the output terminal 5a becomes higher than that at the output terminal 5b, a larger amount of current flows in the PNP transistor Q17 than in the PNP transistor Q16. The NPN transistors Q18 and Q19, having their collectors connected to collectors of the PNP transistors Q16 and Q17 and their bases connected with each other, act as a current mirror circuit. If there is a larger amount of current flowing in the PNP transistor Q17, the current is routed to a base of the PNP transistor Q20, turning on the PNP transistor Q20. Conduction of the PNP transistor Q20 causes that a current from the constant current source C6 to be drawn to the ground potential through a collector and then an emitter of the PNP transistor Q20. Hence, supply of a base current from the constant current source C6 to a base of the PNP transistor Q21 is prohibited and the PNP transistor Q21 turns off. As a result, due to the power source voltage supplied from the resistor R11, an output signal PO3 available at the output terminal 6a turns to "H" level.

On the contrary, when a potential at the output terminal 5a becomes lower than a potential at the output terminal 5b, less amount of current flows in the PNP transistor Q17 than in the PNP transistor Q16. This causes the base of the PNP transistor Q20 current-starved, and therefore, PNP transistor Q20 stays ineffective. During OFF-state of the PNP transistor Q20, the PNP transistor Q21 remains turned on since a base current is supplied from the constant current source C6 to the base of the PNP transistor Q21. Hence, the collector of the PNP transistor Q21 becomes "L" level and so is the output signal PO3 outputted from the output terminal 6a.

Here, it is important to note that the above occurs only when the control signal CS1 from the control circuit 7 is in "high-impedance" state. That is, if the control signal CS1 is at "L" level, with no base current supplied to the base of the PNP transistor Q21, the PNP transistor Q21 stays ineffective and hence the output signal PO3 always stays at "H" level.

In the foregoing, a differential pair circuit part has been described which is comprised of the transistors Q14 to Q21, the resistor R11 and the constant current sources C3 to C6 and which has an active load. A differential pair circuit part has been also described which is comprised of the transistors Q22 to Q29, the resistor R12 and the constant current sources C7 to C10 and which also has an active lead. These two differential pair circuit parts includes therein similar connection and operate in a similar manner under the control of the control signal CS2. However, since voltages at the output terminals 5a and 5b which are to be given to the differential pair are opposite to each other, the output signals PO3 and PO4 are complimentary with each other. As an example of this, Table 1 below shows a relation between potentials on the transmission lines 51 and 52 which are to be inputted to the semiconductor integrated circuit device and the output signals PO3 and PO4.

TABLE 1

| INPUT | | OUTPUT | |
|---|---|---|---|
| Potential at Transmission line 51 | Potential at Transmission line 52 | Output Signal PO3 | Output Signal PO4 |
| High | Low | High | Low |
| Low | High | Low | High |
| No DC Voltage Applied | | High | High |

In Table 1, a potential difference between the transmission lines 51 and 52 is larger than the neutral zone while a dc voltage is applied. It is possible to set the output signals PO3 and PO4 at any desired state by modifying the structure of the comparator 6.

Figure 3:
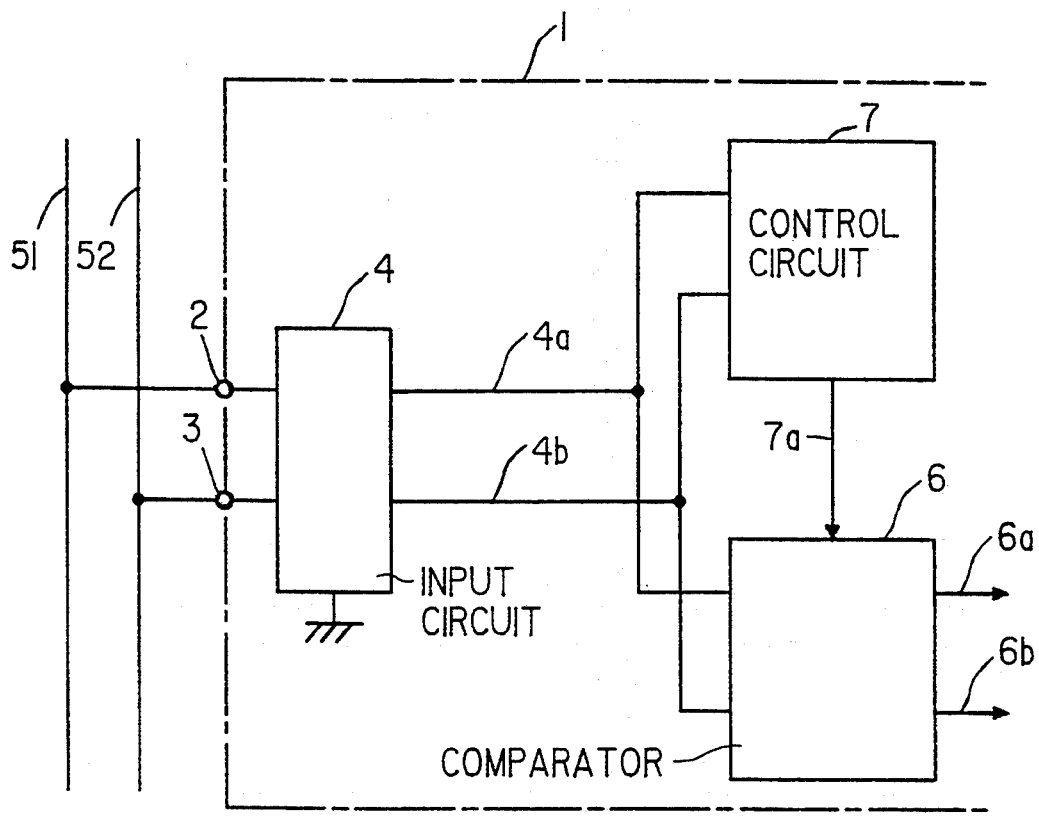
FIG. 3 is a block diagram showing a structure of a semiconductor integrated circuit device according to a second preferred embodiment of the present invention.

A second preferred embodiment of the present invention will be described with reference to drawings. FIG. 3 is a block diagram showing a structure of a semiconductor integrated circuit device according to the second preferred embodiment of the present invention. In FIG. 3, parts similar or corresponding to those previously described with FIG. 1 are denoted by similar reference characters. Omission of the clamp circuit 5 of FIG. 1 is where the semiconductor integrated circuit device of FIG. 3 differs from the semiconductor integrated circuit device of FIG. 1. The clamp circuit 5 described with FIG. 1 sets the upper or the lower limits to the levels of output voltages from the input circuit 4 to the comparator 6 and the control circuit 7 so that potential differences between the output voltages from the input circuit 4 and the ground potential are not equal to or smaller than a preselected level. Hence, in the circuit structure of FIG. 2, if voltages on the transmission lines 51 and 52 are always positive, for example, as compared with the ground potential which is common to the semiconductor integrated circuit device, there is no need to provide a clamp circuit for limiting a voltage lest it should have a certain or lower negative level. That is, unlike in the circuit structure of FIG. 1 where the clamp circuit 5 is provided to compensate for insufficient insulation which is attained by the input circuit 4 so that wider applications are open for the semiconductor integrated circuit device, if the transmission lines are to be used in one certain manner and therefore no such compensation is needed, the clamp circuit may be simply omitted to further reduce the size and the price of the semiconductor integrated circuit device.

Figure 4:
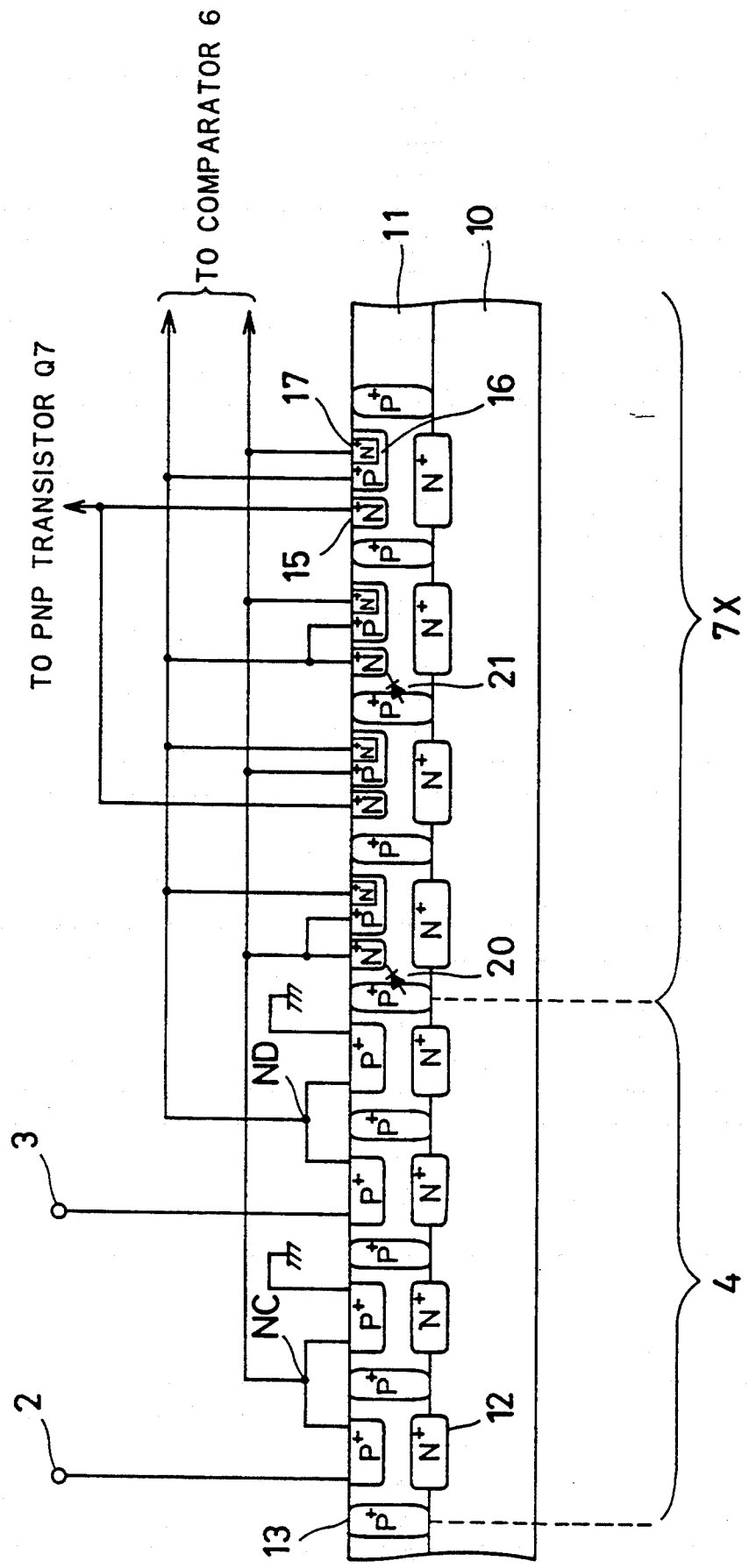
FIG. 4 is a partial sectional view of the structure of the semiconductor integrated circuit device according to the first preferred embodiment.
Figure 5:
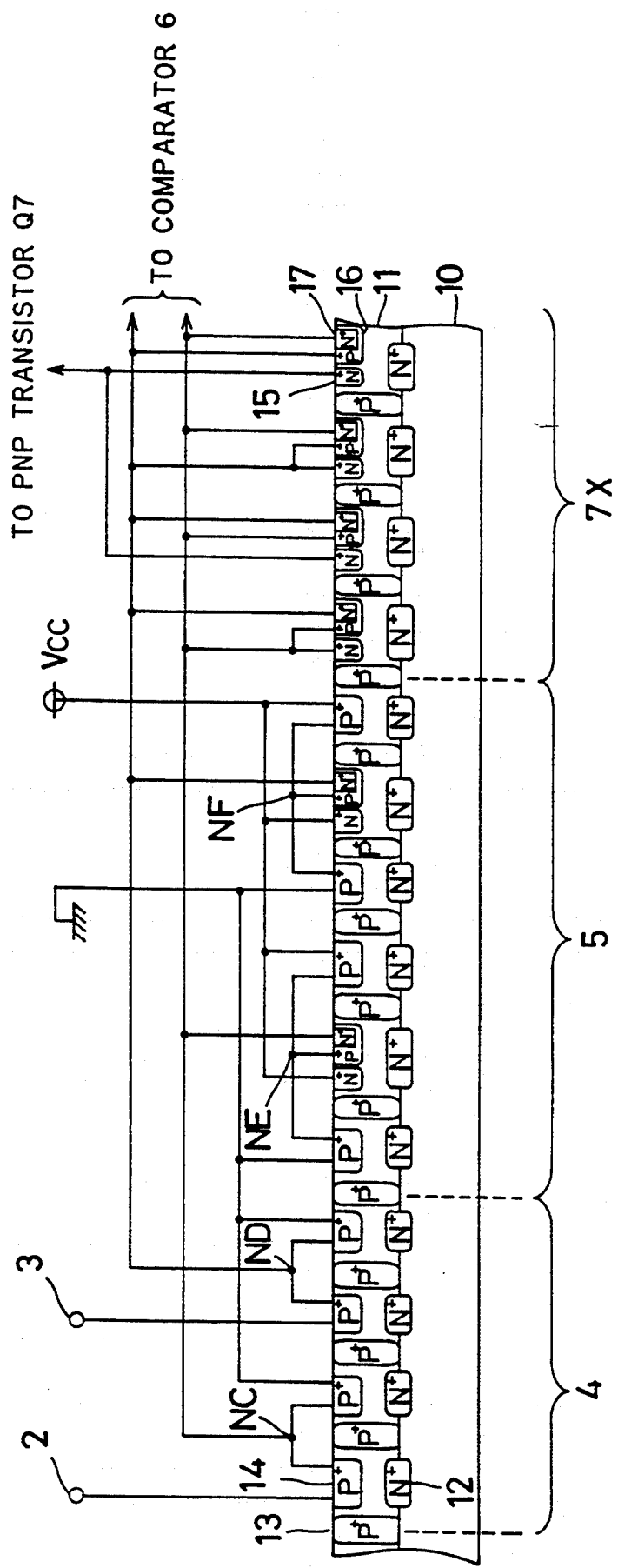
FIG. 5 is a partial sectional view of the structure of the semiconductor integrated circuit device according to the second preferred embodiment.

A function of the parasitic elements will now be described with FIGS. 4 and 5. In FIGS. 4 and 5, indicated at reference numeral 10 is a semiconductor substrate, indicated at 11 is an epitaxial layer formed on the semiconductor substrate 10, indicated at 12 is an N+ type buried layer, indicated at 13 is a P+ type layer for isolating the respective elements, indicated at 14 is a diffusion resistor, indicated at 15 is a collector electrode which is a part of an NPN transistor, indicated at 16 is a base electrode which is a part of the NPN transistor, indicated at 17 is an emitter electrode which is a part of the NPN transistor, and indicated at 7X is a circuit part which detects a voltage difference between two outputs which are outputted from an input circuit which is formed by the NPN transistors Q3 to Q6 of the control circuit of FIG. 2. Other parts similar or corresponding to those previously described with FIG. 2 are denoted by similar reference characters. In the illustrative structure, if the input terminals 2 and 3 each fall to a negative potential, parasitic elements such as diodes 20 and 21 might be activated to invite circuit failure. In other words, there is a possibility that a potential at an node NC or an node ND are clamped at −0.7 V as a result of conduction of the diodes 20 and 21. However, this would not happen if the clamp circuit 5 is provided. Where the clamp circuit 5 is provided, by setting a resistance ratio regarding the resistors R5 to R8, which are connected to the bases of the PNP transistors Q1 and Q2 of the clamp circuit 5, such that potentials of 0.3 V are obtainable at nodes NE and NF, the potentials at the nodes NC and ND become −0.4 V even when the input terminals 2 and 3 fall to a negative potential, thereby rendering the parasitic elements less active.

Figure 9:
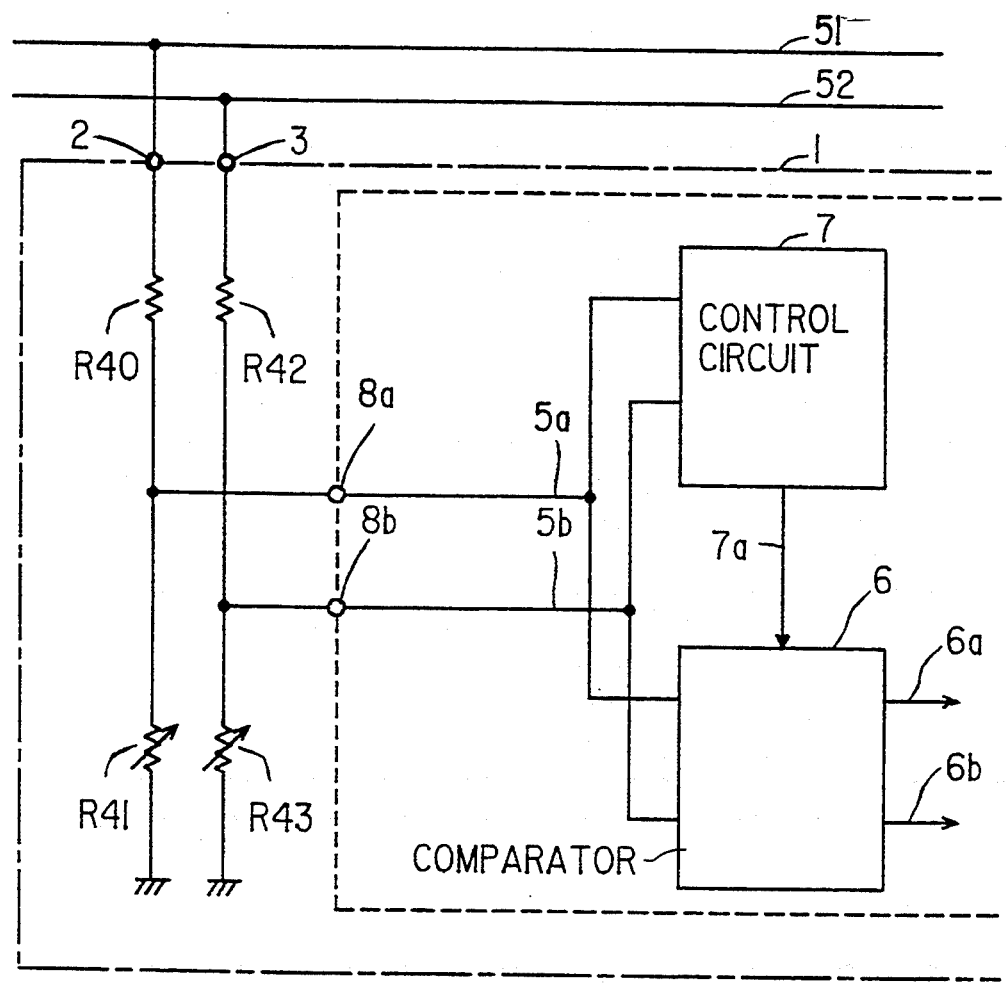
FIG. 9 is a block diagram showing a structure of a semiconductor integrated circuit device according to a third preferred embodiment of the present invention.
Figure 10:
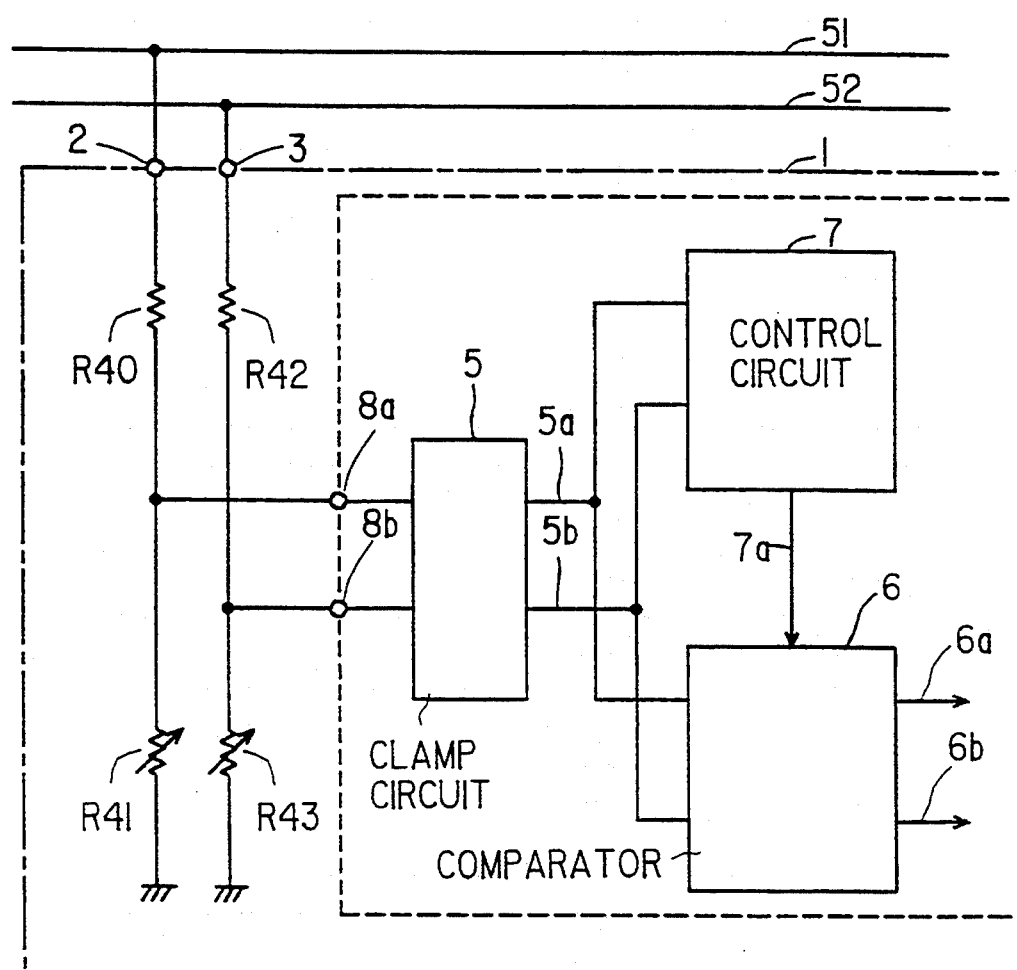
FIG. 10 is a block diagram showing a structure of a semiconductor integrated circuit device according to a fourth preferred embodiment of the present invention.

Next, third and fourth preferred embodiments of the present invention will be described with reference to FIGS. 9 and 10. FIGS. 9 and 10 are block diagrams respectively showing structures of semiconductor integrated circuit devices according to the third and the fourth preferred embodiments of the present invention. In FIGS. 9 and 10, indicated at reference characters R40 to R43 are resistors which form an input circuit which is disposed outside the semiconductor substrate 10. Other parts similar or corresponding to those previously described with FIG. 1 are denoted by similar reference characters. The semiconductor integrated circuit devices of FIGS. 9 and 10 differ from the semiconductor integrated circuit devices of the first and the second preferred embodiments in that the input circuit 4 is located outside the semiconductor substrate 10. In some cases, the semiconductor integrated circuit devices of FIGS. 9 and 10 require adjustment in their neutral zones after fabricated as finished products. To deal with this, the resistors R41 and R43 are formed as variable-resistance resistors, which makes it possible that a resistance ratio of the resistances of the resistors R41 and R43 to the resistances of the resistors R40 and R42 to be changed in actual use of the semiconductor integrated circuit devices. Since the input circuit 4 as shown in FIG. 1 is used to insulate the transmission lines 51 and 52 from the comparator 6, the control circuit 7 and other associated parts, a large voltage will appear at both ends of the resistors R40 and R42. Hence, voltages derived at the input circuit 4 could lead to circuit failure of the semiconductor integrated circuit device. In addition, complex structure and manufacturing process are needed for the input circuit 4. For instance, more sufficient insulation is required for the input circuit 4 than for other parts. For these reasons, provision of the input circuit outside the semiconductor substrate is more desirable under certain circumstances.

While the invention has been described in detail, the foregoing description is in all aspects illustrative and not restrictive. It is understood that numerous other modifications and variations can be devised without departing from the scope of the invention.

I claim:

1. A semiconductor integrated circuit device which is connected to first and second transmission lines for receiving dc voltages of first and second potentials from said first and second transmission lines, respectively, and signals which are superimposed on said dc voltages, said semiconductor integrated circuit device performing detection regarding said dc voltages, said semiconductor integrated circuit device comprising:

first input terminal and a second input terminal respectively connected to said first transmission line and said second transmission line;

a comparison circuit formed on a semiconductor substrate, said comparison circuit comprising: a control signal input terminal for receiving a control signal; a first input terminal and a second input terminal respectively coupled to said first and said second input terminals of said semiconductor integrated circuit device to receive potentials which are obtained in accordance with said first and second potentials which are inputted to said first and said second input terminals of said semiconductor integrated circuit device; and an output terminal, said comparison circuit comparing said first potential with said second potential based on a potential difference between its first and its second input terminals and outputting from its output terminal a result of comparison under the control of said control signal;

a control circuit formed on said semiconductor substrate, said control circuit comprising: a control signal output terminal connected to said control signal input terminal of said comparison circuit; and a first input terminal and a second input terminal respectively coupled to said first and second input terminals of said semiconductor integrated circuit device to receive potentials which are obtained in accordance with said first and said second potentials which are inputted to said first and said second input terminals of said semiconductor integrated circuit device, said control circuit outputting from its control signal output terminal a first control signal which calls for outputting of said result of comparison from said comparison circuit when a potential difference between its first and said second input terminals is equal to or larger than a predetermined positive level, said control circuit outputting from its control signal output terminal a second control signal which prohibits outputting of said result of comparison from said comparison circuit when said potential difference between its first and its second input terminals is smaller than said predetermined positive level.

2. The semiconductor integrated circuit device of claim 1, wherein said control circuit further comprises:

a potential difference detection circuit which is connected to said first and second input terminals of said control circuit, said potential difference detection circuit detecting whether a potential difference between said first and second input terminals of said control circuit is equal to or larger than a predetermined level and outputting a result of detection; and a control signal generation circuit connected to said potential difference detection circuit, said control signal generation circuit generating and outputting one of first and said second control signals in accordance with said result of detection.

3. The semiconductor integrated circuit device of claim 2, wherein said potential difference detection circuit comprises:

a first transistor, a control electrode and a first electrode of said first transistor both being connected to said first input terminal of said control circuit, a second electrode of said first transistor being connected to said second input terminal of said control circuit;

a second transistor, a control electrode of said second transistor being connected to said first input terminal of said control circuit, a first electrode of said second transistor being connected to said control signal generation circuit, a second electrode of said second transistor being connected to said second input terminal of said control circuit, said second transistor in combination with said first transistor forming a current mirror circuit;

a third transistor, a control electrode and a first electrode of said third transistor both being connected to said second input terminal of said control circuit, a second electrode of said third transistor being connected to said first input terminal of said control circuit; and a fourth transistor, a control electrode of said fourth transistor being connected to said second input terminal of said control circuit, a first electrode of said fourth transistor being connected to said control signal generation circuit, a second electrode of said fourth transistor being connected to said first input terminal of said control circuit, said fourth transistor in combination with said third transistor forming a current mirror circuit.

4. The semiconductor integrated circuit device of claim 3, wherein said control signal generation circuit comprises:

a fifth transistor, a first electrode of said fifth transistor being connected to said first electrodes of said second and said fourth transistors, a second electrode of said fifth transistor being connected to a power source, a control electrode of said fifth transistor being connected to its first electrode or its second electrode;

sixth and seventh transistors, control electrodes of said sixth and seventh transistors being connected to said control electrode of said fifth transistor, first electrodes of said sixth and seventh transistors being connected to said power source, said sixth and seventh transistors in combination with said fifth transistor forming a current mirror circuit;

first voltage drop means having a first terminal connected to a second electrode of said sixth transistor;

second voltage drop means having a first terminal connected to a second, electrode of said seventh transistor;

an eighth transistor, a control electrode of said eighth transistor being connected to a second terminal of said first voltage drop means, a first electrode of said eighth transistor being connected to a third potential;

a ninth transistor, a control electrode of said ninth transistor being connected to a second terminal of said second voltage drop means, electrode a electrode of said ninth transistor being connected to said third potential;

a first constant current source having a first terminal connected to a second electrode of said eighth transistor, said first constant current source supplying a predetermined dc current;

a second constant current source having a first terminal connected to said second electrode of said ninth transistor, said first constant current source supplying a predetermined dc current;

a tenth transistor, a control electrode of said tenth transistor being connected to said second electrode of said eighth transistor, a first electrode of said tenth transistor being connected to said third potential, said tenth transistor outputting said first or said second control signal from its second electrode; and an eleventh transistor, a control electrode of said eleventh transistor being connected to said second electrode of said ninth transistor, a first electrode of said eleventh transistor being connected to said third potential, said eleventh transistor outputting said first or said second control signal from its second electrode.

5. The semiconductor integrated circuit device of claim 2, wherein said comparison circuit comprises:

a first differential amplifier circuit, said first differential amplifier circuit receiving respectively at its noninverted and inverted input terminals potentials applied to said first and said second input terminals of said comparison circuit; and a second differential amplifier circuit, said second differential amplifier circuit receiving respectively at its noninverted and inverted input terminals potentials applied to said first and said second input terminals of said comparison circuit.

6. The semiconductor integrated circuit device of claim 5, wherein said comparison circuit further comprises:

a first output circuit for receiving an output of said first differential amplifier circuit and an output of said control signal generation circuit, said first output circuit outputting a signal in accordance with said output from said first differential amplifier circuit if said output from said control signal generation circuit is said first control signal, said first output circuit outputting no signal in accordance with said output from said first differential amplifier circuit if said output from said control signal generation circuit is said second control signal; and a second output circuit for receiving an output of said second differential amplifier circuit and an output of said control signal generation circuit, said second output circuit outputting a signal in accordance with said output from said second differential amplifier circuit if said output from said control signal generation circuit is said first control signal, said second output circuit outputting no signal in accordance with said output from said second differential amplifier circuit if said output from said control signal generation circuit is said second control signal.

7. The semiconductor integrated circuit device of claim 6, wherein said first output circuit comprises:

a first transistor, a control electrode of said first transistor receiving an output of said first differential amplifier circuit, a first electrode of said first transistor being connected to a third potential;

a first constant current source for supplying a predetermined constant current to a second electrode of said first transistor;

a second transistor, a first electrode of said second transistor being connected to said third potential, a control electrode of said second transistor being connected to said second electrode of said first transistor, said second transistor receiving at said control electrode thereof an output of said control signal generation circuit; and first voltage drop means, a first terminal of said first voltage drop means being connected to a second electrode of said second transistor, a second terminal of said first voltage drop means being connected to a power source, said second output circuit comprises:

a third transistor, a control electrode of said third transistor receiving an output of said second differential amplifier circuit, a first electrode of said third transistor being connected to said third potential;

a second constant current source for supplying a predetermined dc voltage to a second electrode of said third transistor;

a fourth transistor, a first electrode of said fourth transistor being connected to said third potential, a control electrode of said fourth transistor being connected to said second electrode of said third transistor, said fourth transistor receiving at said control electrode thereof an output of said control signal generation circuit; and second voltage drop means, a first terminal of said second voltage drop means being connected to a second electrode of said fourth transistor, a second terminal of said second voltage drop means being connected to said power source, and wherein said second electrode of said second transistor serves as an output terminal of said first output circuit and said second electrode of said fourth transistor serves as an output terminal of said second output circuit.

8. The semiconductor integrated circuit device of claim 6, wherein said first and said second differential amplifier circuits each further comprise an active load.

9. The semiconductor integrated circuit device of claim 8, wherein said first differential amplifier circuit further comprises:

a first constant current source for supplying a predetermined dc current;

a first transistor, a control electrode of said first transistor being connected to said noninverted input terminal of said first differential amplifier circuit, a first electrode of said first transistor being connected to a first terminal of said first constant current source;

a second transistor, a control electrode of said second transistor being connected to said inverted input terminal of said first differential amplifier circuit, a first electrode of said second transistor being connected to said first terminal of said first constant current source;

a third transistor, a first electrode and a control electrode of said third transistor being connected to a second electrode said first transistor, a second electrode of said third transistor being connected to said third potential; and a fourth transistor, a first electrode of said fourth transistor being connected to a second electrode of said second transistor, a control electrode of said fourth transistor being connected to said control electrode of said third transistor, a second electrode of said fourth transistor being connected to said third potential, said first electrode of said fourth transistor serving as an output terminal of said first differential amplifier circuit, said second differential amplifier circuit further comprises:
a second current source for supplying a predetermined dc current;
a fifth transistor, a control electrode of said fifth transistor being connected to said noninverted input terminal of said second differential amplifier circuit, a first electrode of said fifth transistor being connected to a first terminal of said second constant current source;
a sixth transistor, a control electrode of said sixth transistor being connected to said inverted input terminal of said second differential amplifier circuit, a first electrode of said sixth transistor being connected to said first terminal of said second constant current source;
a seventh transistor, a first electrode and a control electrode of said seventh transistor being connected to a second electrode of said fifth transistor, a second electrode of said seventh transistor being connected to said third potential; and
an eighth transistor, a first electrode of said eighth transistor being connected to a second electrode of said sixth transistor, a control electrode of said eighth transistor being connected to said control electrode of said seventh transistor, a second electrode of said eighth transistor being connected to said third potential, said second electrode of said eighth transistor serving as an output terminal of said second differential amplifier circuit.

10. The semiconductor integrated circuit device of claim 6, wherein said control circuit further comprises:
a first buffer circuit connected between said first and said second input terminals of said control circuit and said noninverted and said inverted input terminals of said first differential amplifier circuit, said first buffer circuit reducing interaction between said first and said second input terminals of said control circuit and said noninverted and said inverted input terminals of said first differential amplifier circuit; and
a second buffer circuit connected between said first and said second input terminals of said control circuit and said noninverted and said inverted input terminals of said second differential amplifier circuit, said second buffer circuit reducing interaction between said first and said second input terminals of said control circuit and said noninverted and said inverted input terminals of said second differential amplifier circuit.

11. The semiconductor integrated circuit device of claim 10, wherein said first buffer circuit comprises:
a first transistor, a control electrode of said first transistor being connected to said first input terminal of said control circuit, a first electrode of said first transistor being connected to said noninverted input terminal of said first differential amplifier circuit, a second electrode of said first transistor being connected to a third potential;
a first constant current source connected to said first electrode of said first transistor to supply a predetermined dc voltage;
a second transistor, a control electrode of said second transistor being connected to said second input terminal of said control circuit, a first electrode of said second transistor being connected to said inverted input terminal of said first differential amplifier circuit, a second electrode of said second transistor being connected to said third potential; and
a second constant current source connected to said first electrode of said second transistor to supply a predetermined dc voltage, said second buffer circuit comprises:
a third transistor, a control electrode of said third transistor being connected to said first input terminal of said control circuit, a first electrode of said third transistor being connected to said noninverted input terminal of said second differential amplifier circuit, a second electrode of said third transistor being connected to said third potential;
a third constant current source connected to said first electrode of said third transistor to supply a predetermined dc voltage;
a fourth transistor, a control electrode of said fourth transistor being connected to said second input terminal of said control circuit, a first electrode of said fourth transistor being connected to said inverted input terminal of said second differential amplifier circuit, a second electrode of said fourth transistor being connected to said third potential; and
a fourth constant current source connected to said first electrode of said fourth transistor to supply a predetermined dc voltage.

12. The semiconductor integrated circuit device of claim 1, further comprising an input circuit having a high input impedance, said input circuit comprising: first and second input terminals respectively connected to said first and second input terminals of said semiconductor integrated circuit device; and first and second output terminals respectively connected to said first and second input terminals of said comparison circuit and said control circuit, said input circuit voltage-dividing at a preselected ratio potential differences between its first input terminal and a reference potential and between its second input terminal and said reference potential, and outputting divided potentials.

13. The semiconductor integrated circuit device of claim 12, wherein said input circuit consists only of voltage drop means.

14. The semiconductor integrated circuit device of claim 13, wherein said input circuit comprises:
first voltage drop means, a first terminal of said first voltage drop means being connected to said first input terminal of said input circuit, a second terminal said first voltage drop means being connected to said first output terminal of said input circuit;
second voltage drop means, a first terminal of said second voltage drop means being connected to said second input terminal of said input circuit, a second terminal of said second voltage drop means being connected to said second output terminal of said input circuit;
third voltage drop means, a first terminal of said third voltage drop means being connected to said second terminal of said first voltage drop means, a second terminal of said third voltage drop means being connected to a third potential; and
fourth voltage drop means, a first terminal of said fourth voltage drop means, a second terminal of fourth voltage drop means being connected to said third potential.

15. The semiconductor integrated circuit device of claim 14, wherein said first, said second, said third and said fourth voltage drop means are formed on said semiconductor substrate.

16. The semiconductor integrated circuit device of claim 14, wherein said first, said second, said third and said fourth voltage drop means are formed outside said semiconductor substrate.

17. The semiconductor integrated circuit device of claim 14, wherein a resistance ratio of a resistance of said first voltage drop means to a resistance of said third voltage drop means is equal to a resistance ratio of a resistance of said second voltage drop means to a resistance of said fourth voltage drop means.

18. The semiconductor integrated circuit device of claim 15, wherein at least one of said second and said fourth voltage drop means is formed on said semiconductor substrate and includes a plurality of resistor means which are connected in parallel.

19. The semiconductor integrated circuit device of claim 18, wherein a resistance of said at least one of said second and said fourth voltage drop means is changed by disconnecting said plurality of said resistor means connected in parallel by irradiation of a laser.

20. The semiconductor integrated circuit device of claim 12, further comprising a clamp circuit, said clamp circuit being formed on said semiconductor substrate, said clamp circuit being connected to said first and second output terminals of said input circuit, said clamp circuit limiting potential differences between said first output terminal of said input circuit and said reference potential and between said second output terminal of said input circuit and said reference potential to a predetermined voltage.

21. The semiconductor integrated circuit device of claim 20, wherein said clamp circuit comprises:
a first switching element connected to said first output terminal of said input circuit such that when a potential difference between said first output terminal and said third potential reaches said predetermined voltage, said first switching element turns on to limit said potential difference to said predetermined voltage; and
a second switching element connected to said second output terminal of said input circuit such that when a potential difference between said second output terminal and said third potential reaches said predetermined voltage, said first switching element turns on to reduce said potential difference to said predetermined voltage.

22. The semiconductor integrated circuit device of claim 21, wherein said first switching element includes:
a first transistor, a first electrode of said first transistor being connected to said first output terminal of said input circuit, a second electrode of said first transistor being connected to a power source; and
said second switching element including a second transistors, a first electrode of said second transistor being connected to said second output terminal of said input circuit, a second electrode of said second transistor being connected to said power source, and
said clamp circuit further comprises:
first voltage drop means connected between a control electrode of said first transistor and said power source;
second voltage drop means connected between a control electrode of said second transistor and said power source;
third voltage drop means connected between said control electrode of said first transistor and said third potential; and
fourth voltage drop means connected between said controlled electrode of said second transistor and said third potential.

23. The semiconductor integrated circuit device of claim 12, wherein said control circuit comprises a switching element which is connected to said first and said second transmission lines, and
said switching element turns on or turns off to thereby demand said first control signal to be outputted when potentials at said first and said second transmission lines become equal to or larger than said predetermined level, and turns off or turns on to thereby demand said second control signal to be outputted when the potentials at said first and said second transmission lines do not reach said predetermined positive level.

24. The semiconductor integrated circuit device of claim 23, wherein said switching element includes:
a first transistor having a base which is connected to said first transmission line, an emitter which is connected to said second transmission line and a collector which outputs a signal which calls for outputting of said first or said second control signal; and
a second transistor having a base which is connected to said second transmission line, an emitter which is connected to said first transmission line and a collector which outputs a signal which calls for outputting of said first or said second control signal.

* * * * *